United States Patent
Bandyopadhyay

(10) Patent No.: US 11,539,373 B2
(45) Date of Patent: Dec. 27, 2022

(54) METHOD TO COMPENSATE FOR METASTABILITY OF ASYNCHRONOUS SAR WITHIN DELTA SIGMA MODULATOR LOOP

(71) Applicant: Analog Devices, Inc., Wilmington, MA (US)

(72) Inventor: Abhishek Bandyopadhyay, Winchester, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/339,369

(22) Filed: Jun. 4, 2021

(65) Prior Publication Data

US 2021/0297087 A1    Sep. 23, 2021

Related U.S. Application Data

(63) Continuation of application No. PCT/US2019/065193, filed on Dec. 9, 2019.
(Continued)

(51) Int. Cl.
*H03M 1/34* (2006.01)
*H03M 1/46* (2006.01)
(Continued)

(52) U.S. Cl.
CPC ......... *H03M 1/462* (2013.01); *H03M 1/0854* (2013.01); *H03M 1/125* (2013.01); *H03M 3/426* (2013.01); *H03M 3/464* (2013.01)

(58) Field of Classification Search
CPC ........ H03M 1/125; H03M 1/462; H03M 1/46; H03M 1/466; H03M 1/0863; H03M 1/38;
(Continued)

(56) References Cited

U.S. PATENT DOCUMENTS

| 6,603,415 | B1 | 8/2003 | Somayajula | |
| 8,344,925 | B1 * | 1/2013 | Evans | H03M 1/462 341/120 |

(Continued)

FOREIGN PATENT DOCUMENTS

| JP | 2013-201691 | 10/2013 |
| KR | 10-1686217 | 12/2016 |

OTHER PUBLICATIONS

International Search Report and Written Opinion for PCT/US2019/065193 dated May 12, 20, 10 pages.
(Continued)

*Primary Examiner* — Linh V Nguyen
(74) *Attorney, Agent, or Firm* — Akona IP PC

(57) ABSTRACT

Herein disclosed are some examples of metastability detectors and compensator circuitry for successive-approximation-register (SAR) analog-to-digital converters (ADCs) within delta sigma modulator (DSM) loops. A metastability detector may detect metastability at an output of a SAR ADC and compensator circuitry may implement a compensation scheme to compensate for the metastability. The identification of the metastability and/or compensation for the metastability can avoid detrimental effects and/or errors to the DSM loops that may be caused by the metastability of the SAR ADCS.

20 Claims, 9 Drawing Sheets

Related U.S. Application Data

(60) Provisional application No. 62/777,288, filed on Dec. 10, 2018.

(51) Int. Cl.
  *H03M 1/08* (2006.01)
  *H03M 1/12* (2006.01)
  *H03M 3/00* (2006.01)

(58) Field of Classification Search
  CPC .......... H03M 1/468; H03M 1/00; H03M 1/06; H03M 1/0607; H03M 1/0612; H03M 1/0682; H03M 1/069; H03M 1/0695; H03M 1/0697; H03M 1/0836; H03M 1/12
  USPC .................................. 341/118–120, 155, 172
  See application file for complete search history.

(56) References Cited

U.S. PATENT DOCUMENTS

| | | | |
|---|---|---|---|
| 8,482,449 B1 | 7/2013 | Zabroda | |
| 8,786,483 B1* | 7/2014 | Thompson | H03M 1/0836 341/161 |
| 8,872,691 B1* | 10/2014 | Stepanovic | H03M 1/06 341/158 |
| 8,957,802 B1* | 2/2015 | Evans | H03M 1/0863 341/161 |
| 9,258,008 B2* | 2/2016 | Singh | H03M 1/462 |
| 9,379,726 B1* | 6/2016 | Wang | H03M 1/125 |
| 9,484,945 B1* | 11/2016 | Wan | H03M 1/0863 |
| 9,614,540 B1* | 4/2017 | Kull | H03M 1/125 |
| 9,621,179 B1* | 4/2017 | Maulik | H03M 1/0863 |
| 9,912,343 B1* | 3/2018 | Li | H03M 1/1009 |
| 9,985,640 B1* | 5/2018 | Wen | H03M 1/1038 |
| 10,044,364 B1 | 8/2018 | Sharif | |
| 2005/0057387 A1* | 3/2005 | Janakiraman | H03M 1/208 341/172 |
| 2012/0306675 A1* | 12/2012 | Kapusta | H03M 1/0641 341/131 |
| 2017/0346500 A1* | 11/2017 | Chen | H03M 1/06 |

OTHER PUBLICATIONS

EN Translation (using Patent Translate) of JP20130201691, 24 pages.
EN Translation (using Patent Translate) of KR101686217, 14 pages.
Kang et al., *A 12b 11MS/s Successive Approximation ADC with Two Comparators in 0.13µm CMOS*, 2009 Symposium on VLSI Circuits Digest of Technical Papers, 2 pages.
Yang et al., *A 1 GS/s 6 Bit 6.7 mW Successive Approximation ADU Using Asynchronous Processing*, IEEE Journal of Solid-State Circuits, vol. 45, No. 8, Aug. 2010, 10 pages.
Yang et al., *A 1-GS/s 6-bit 6.7-mW ADC in 65-nm CMOS*, Nov. 19, 2010, 5 pages.

* cited by examiner

METHOD TO COMPENSATE FOR METASTABILITY OF ASYNCHRONOUS SAR WITHIN DELTA SIGMA MODULATOR LOOP

RELATED APPLICATIONS

The present disclosure claims priority to, as a bypass continuation, International Patent Application Serial No. PCT/US2019/065193, entitled "COMPENSATION FOR METASTABILITY OF ASYNCHRONOUS SAR WITHIN DELTA SIGMA MODULATOR LOOP" and filed Dec. 9, 2019. The International Patent application claims priority to and receives benefit of U.S. Provisional Application No. 62/777,288 entitled "METHOD TO COMPENSATE FOR METASTABILITY OF ASYNCHRONOUS SAR WITHIN DELTA SIGMA MODULATOR LOOP" and filed Dec. 10, 2018. Both the International Patent Application and the US Provisional application are incorporated by reference in their entirety.

FIELD OF THE DISCLOSURE

The present disclosure relates to the field of integrated circuits, in particular to delta sigma modulators, which may include an asynchronous successive-approximation-register analog-to-digital converter.

BACKGROUND

In many electronics applications, an analog-to-digital converter (ADC) converts an analog input signal to a digital output signal, e.g., for further digital signal processing or storage by digital electronics. Broadly speaking, ADCs can translate analog electrical signals representing real-world phenomenon, e.g., light, sound, temperature, electromagnetic waves, or pressure for data processing purposes. For instance, in measurement systems, a sensor makes measurements and generates an analog signal. The analog signal would then be provided to an ADC as input to generate a digital output signal for further processing. In another instance, a transmitter generates an analog signal using electromagnetic waves to carry information in the air or a transmitter transmits an analog signal to carry information over a cable. The analog signal is then provided as input to an ADC at a receiver to generate a digital output signal, e.g., for further processing by digital electronics.

Due to their wide applicability in many applications, ADCs can be found in places such as broadband communication systems, audio systems, receiver systems, etc. Designing circuitry in ADC is a non-trivial task because each application may have different needs in performance, power, cost, and size. ADCs are used in a broad range of applications including Communications, Energy, Healthcare, Instrumentation and Measurement, Motor and Power Control, Industrial Automation and Aerospace/Defense. As the applications needing ADCs grow, the need for fast yet accurate conversion also grows.

One particular type of ADC that may be utilized is an asynchronous successive-approximation-register (SAR) ADC. Asynchronous SAR ADCs are more power efficient than other ADCs and can be used to eliminate high frequency clocks utilized by other ADCs. However, SAR ADCs may present metastability issues, which can halt the conversion process being performed by the SAR ADCs. Some legacy approaches to addressing metastability include adding extra comparators and/or attempting to detect the metastability on subsequent clock cycles of a clock that triggers the conversion process. These legacy approaches add additional loading to the SAR ADC, increase power consumption by and area for the comparator (or comparators) of the SAR ADC, and/or add delay to the conversion process by the asynchronous SAR ADC.

SUMMARY OF DISCLOSURE

Herein disclosed are some examples of metastability detectors and compensator circuitry for successive-approximation-register (SAR) analog-to-digital converters (ADCs) within delta sigma modulator (DSM) loops. A metastability detector may detect metastability at an output of a SAR ADC and compensator circuitry may implement a compensation scheme to compensate for the metastability. The identification of the metastability and/or compensation for the metastability can avoid detrimental effects and/or errors to the DSM loops that may be caused by the metastability of the SAR ADCs.

In certain embodiments, an apparatus is provided for detecting metastability of a successive-approximation-register (SAR) analog-to-digital converter (ADC). The apparatus comprises a reference clock, wherein a signal of the reference clock has a same frequency as and is offset from a signal of an ADC clock of the SAR ADC that triggers conversion by the SAR ADC. The apparatus further comprises a flip-flop coupled to the SAR ADC and the reference clock, wherein the flip-flop is configured to latch a value of a ready signal output by the SAR ADC when triggered by the signal of the reference clock and output an indication of whether metastability of the SAR ADC has been detected based on the latched value of the ready signal.

In certain embodiments, a delta sigma modulator (DSM) loop is provided. The DSM loop comprises an asynchronous SAR ADC, wherein conversion by the asynchronous SAR ADC is triggered by an ADC clock. The DSM loop further comprises a metastability detector coupled to the asynchronous SAR ADC to receive a ready signal from the asynchronous SAR ADC, wherein the metastability detector is triggered by a reference clock and detects metastability of the asynchronous SAR ADC based on the ready signal in response to being triggered by the reference clock.

In certain embodiments, a method of detecting metastability of an asynchronous SAR ADC is provided. The method comprises detecting, by the metastability detector, a falling edge of a reference signal produced by a reference clock, and latching, by the metastability detector, a value of a ready signal of the SAR ADC in response to detecting the falling edge of the reference signal. The method further comprises outputting, by the metastability detector, an indication of whether metastability of the SAR ADC has been detected based on the latched value of the ready signal.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Overview

Comparators are often used in many different kinds of analog-to-digital converters (ADCs), including successive-approximation-register (SAR) ADCs. Unfortunately, the comparators can present a metastable state during the conversion process. If a comparator presents a metastable state at certain times during the conversion process, the presentation of the metastable state can halt the operation of an ADC and/or cause other issues, especially if the comparator is used in a feedback system. It is therefore advantageous to implement a metastability detector that can detect and a metastability compensator to compensate for comparator metastability. One example application of the metastability detector and metastability compensator is in an asynchronous SAR ADC used as a quantizer, as part of a delta sigma modulator, or as part of any feedback system.

Metastability and its Effect on Delta Sigma Modulators/Loops

The latched comparator is a fundamental building block of some ADCs, such as SAR ADCs and delta sigma ADCs (including delta sigma modulators/loops). Generally speaking, latching comparators may present metastability issues. When a comparator has not settled in a valid state (i.e., an output of the comparator is between a logical one and a logical zero, or continuously bounces between the logical one and logical zero), it is said to be in a metastable state. Metastability occurs when the comparator is in a metastable state at a designated time, such as a clock edge. Metastability is a random phenomenon. In an asynchronous SAR ADC, metastability of a comparator can halt the conversion process. This can be detrimental when the asynchronous SAR ADC is used as a quantizer as part of the delta sigma modulator's feedback loop. Noise floor gets affected and can render the ADC non-functional. Signal to Noise Ratio (SNR) gets degraded. Effect is more pronounced when metastability happens for/during most significant bit (MSB) trials. Some legacy systems try to address the metastability issues, but have limitations and trade-offs.

Delta Sigma Modulator Having a SAR ADC in the Loop

Figure 1:
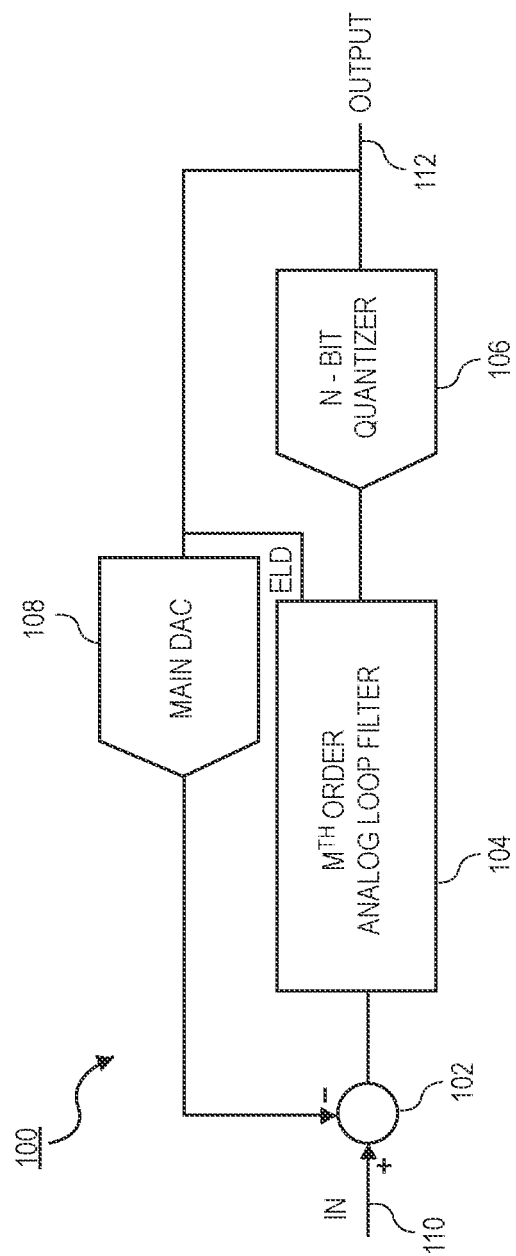
FIG. 1 shows an example DSM loop, according to some embodiments of the disclosure.

FIG. 1 shows an example delta sigma modulator (DSM) loop 100, according to some embodiments of the disclosure.

The DSM loop 100 is an oversampled ADC. For example, the DSM loop 100 receives an analog signal at an input 110 of the DSM loop 100 and outputs a digital signal representation of the analog signal at an output 112 of the DSM loop 100.

The DSM loop 100 includes a summation node 102. The summation node 102 is utilized as part of a feedback loop of the DSM loop 100. In particular, the summation node 102 receives an analog signal from the input 110 of the DSM loop 100 and an analog signal looped back to the summation node 102 via a main digital-to-analog converter (DAC) 108. The summation node 102 subtracts the analog signal received from the main DAC 108 from the analog signal received via the input 110 to produce an analog signal. The summation node 102 may be implemented by any logic that provides for the summation of two analog signals. Further, the summation node 102 may include logic that negates the analog signal received from the main DAC 108.

The analog signal produced by the summation node 102 is provided to an analog loop filter 104 of the DSM loop 100. The analog loop filter 104 may comprise an $M^{th}$ order analog loop filter, where M is a positive integer. The analog loop filter 104 can filter noise from the differential analog to produce a filtered differential analog signal at an output of the analog loop filter 104. The type of the analog loop filter 104 may be selected based on the application in which the DSM loop 100 is being implemented. For example, the analog loop filter 104 may be a low-pass filter, a high-pass filter, or a band-pass filter based on the application in which the DSM is implemented.

The filtered differential analog signal produced by the analog loop filter 104 is provided to a quantizer 106 of the DSM loop 100. The quantizer 106 may comprise an N-bit quantizer, where N is a positive integer. The filtered differential analog signal is quantized by the quantizer 106. In particular, the quantizer 106 may produce an N-bit digital output signal that represents the filtered differential analog signal. In some embodiments, the quantizer 106 comprises the asynchronous SAR ADC 200 described in relation to FIG. 2.

The digital output signal from the quantizer 106 is provided to the output 112 of the DSM loop 100 and to the main DAC 108. The main DAC 108 converts the digital output signal received from the quantizer 106 to an analog signal that represents the digital output signal, where the analog signal is provided to the summation node 102 for summation with the analog signal from the input 110. Further, the digital output signal from the quantizer is provided to the analog loop filter 104. The analog loop filter 104 can perform excess loop delay (ELD) compensation based on the digital output signal. From sample to sample, the code change at the digital output can be a few bits.

In some legacy implementation of DSM loops, a quantizer of the DSM loops (such as the quantizer 106) utilizes a Flash ADC (e.g., a bank of comparators to generate N bits). Flash ADCs can be power hungry and area inefficient, so some DSM loops may use a SAR ADC instead. SAR ADCs are the most power efficient ADCs, and using an asynchronous SAR ADC can eliminate the use of high frequency clocks needed for the bit trials during the conversion phase. Typically, the quantizer 106 has to convert at speeds higher than the ADC clock rate to account for operations like Dynamic Element Matching (DEM) in the main DAC 108, settling of the main DAC 108, excess loop delay compensation, etc.

Asynchronous SAR ADC Architecture

Figure 2A:
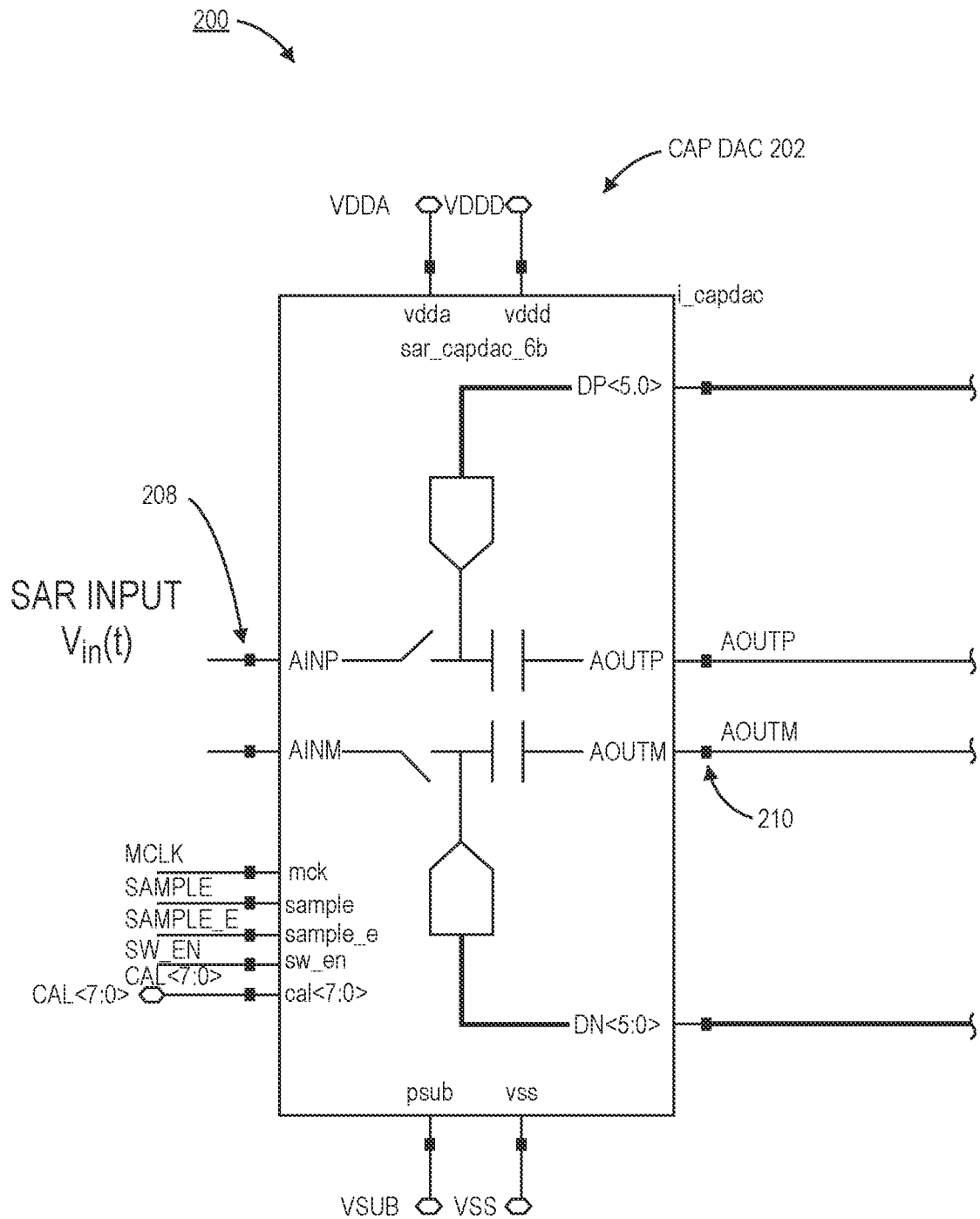
FIG. 2A shows a portion of an example asynchronous SAR ADC 200, according to some embodiments of the disclosure.
Figure 2B:
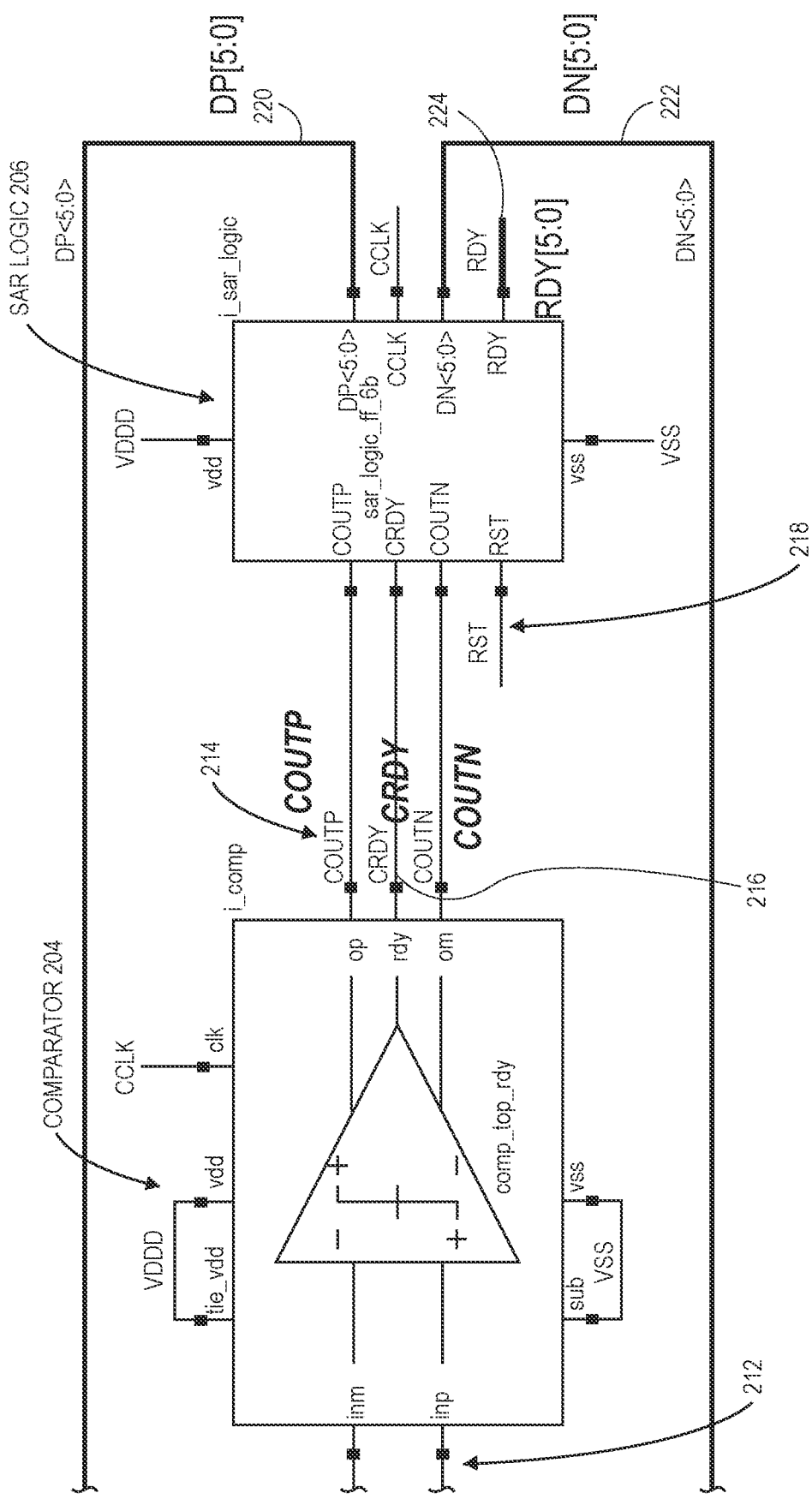
FIG. 2B shows another portion of the example asynchronous SAR ADC 200 of FIG. 2A, according to some embodiments of the disclosure.

FIG. 2A shows a portion of an example asynchronous SAR ADC 200, according to some embodiments of the disclosure. FIG. 2B shows another portion of the example asynchronous SAR ADC 200 of FIG. 2A, according to some embodiments of the disclosure. The lines with break indicators at the right side of the FIG. 2A may couple with the lines with break indicators at the bottom of the FIG. 2B. FIG. 2A and FIG. 2B may collectively be referred to as FIG. 2 throughout this disclosure. In some embodiments, the asynchronous SAR ADC 200 comprises a fully differential asynchronous SAR ADC. The SAR ADC 200 can be implemented within the quantizer 106 (FIG. 1) in some embodiments.

The asynchronous SAR ADC 200 includes a capacitive digital-to-analog converter (CAP DAC) 202. The CAP DAC 202 is coupled to inputs 208 of the asynchronous SAR ADC 200. The inputs 208 may be coupled to an analog loop filter, such as the analog loop filter 104 (FIG. 1). The CAP DAC 202 may sample the signal received from the analog loop filter. The sampling may be controlled by outputs of SAR logic 206 of the SAR ADC 200. The CAP DAC 202 outputs the samplings of the signal on outputs 210.

The SAR ADC 200 further includes a comparator 204. The comparator 204 may be a fully dynamic, high-speed comparator in some embodiments. Inputs 212 of the comparator 204 are coupled to the outputs 210 of the CAP DAC 202 and receives the samplings from the CAP DAC 202. The comparator 204 compares the samplings and outputs results of the comparison (which may be referred to as "comparator output data") on outputs 214. The comparator 204 further outputs an indication of whether a bit trial has been completed on a comparison ready output, CRDY 216. In particular, the bit trial may be completed when the comparator 204 settles on a valid bit (either a logical one or a logical zero) on the outputs 214 for the bit trial. The outputs 214 of the comparator 204 may be in a metastable state prior to the indication of whether the bit trial has been completed being output on CRDY 216.

The SAR ADC 200 further includes SAR logic 206. The SAR logic 206 may be custom dynamic latch based SAR logic in some embodiments. Inputs 218 of the SAR logic 206 are coupled to the outputs 214 and the CRDY 216 of the comparator 204. The SAR logic 206 latches the values on the outputs 214 and the CRDY 216. The SAR logic 206 outputs the latched values on outputs of the SAR logic 206. In particular, the SAR logic 206 outputs the latched values of the results of the comparison by the comparator 204 on a first comparison output 220 (labeled "DP[5:0]") and a second comparison output 222 (labeled "DN[5:0]"). The value on the first comparison output 220 and the value of the second comparison output 222 controls the capacitors of the CAP DAC 202, such as charge redistribution for subsequent bit trials, and/or may control data applied to the CAP DAC 202. Further, the SAR logic 206 outputs the latched value of CRDY 216 on ready output, RDY 224.

In the illustrated embodiment, the SAR ADC 200 is a 6-bit SAR ADC. In other embodiments, the SAR ADC 200 may have greater or fewer bits than illustrated. For example, the SAR ADC 200 may produce output of greater than or fewer than six bits.

Detecting Metastability

Detection of metastability can be detected at any bit decision produced by the comparator 204. For example, metastability of the outputs 214 of the comparator 204 can be detected after each bit trial performed by the SAR ADC 200. In some embodiments, which bit decisions detection of metastability is to be performed for may be programmable. For example, metastability of the outputs 214 of the comparator 204 can be detected only after certain defined bit trials in accordance with programming. Metastability can be detected at a certain time, as described further in relation to FIG. 3. The reference in time (e.g., a reference clock) can be derived locally using asynchronous circuits or from a global clock.

Figure 3:
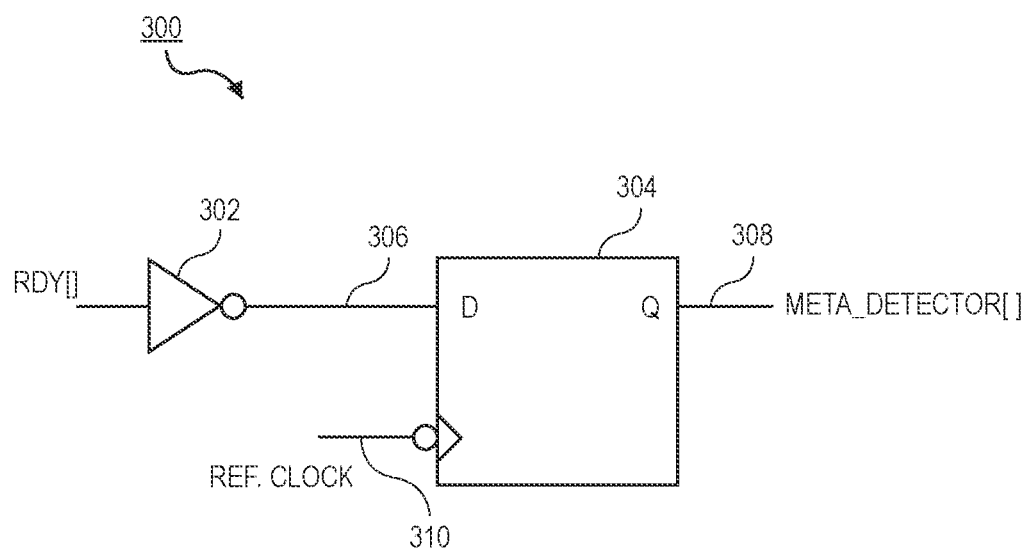
FIG. 3 shows an example metastability detector, according to some embodiments of the disclosure.

FIG. 3 shows an example metastability detector 300, according to some embodiments of the disclosure. The metastability detector 300 comprises a flip-flop 304. The flip-flop 304 may comprise a D flip-flop. The flip-flop 304 may latch a value on an input 306 of the flip-flop 304 when triggered and may output the value on an output 308 of the flip-flop 304.

An input 306 of the flip-flop 304 is coupled to RDY 224 (FIG. 2) of the SAR ADC 200 (FIG. 2), where RDY 224 has the latched value of the indication of whether a bit trial has been completed. In the illustrated embodiment, an inverter 302 is coupled between the RDY 224 and the flip-flop 304, where the inverter 302 inverts the value on RDY 224. In other embodiments, the inverter 302 may be omitted and the flip-flop 304 may receive the value on RDY 224 that has not been inverted.

A clock input 310 of the flip-flop 304 is coupled to a reference clock. The reference clock has a timing that is different from an ADC clock that triggers a bit trial of the SAR ADC 200. In particular, the reference clock may be a same frequency as the ADC clock with a phase of the reference clock offset from the ADC clock. The reference clock may be a separate clock from the ADC clock or may be derived from the ADC clock. The reference clock may trigger the flip-flop 304, where the flip-flop 304 latches the value on the input 306 and outputs the latched value on the output 308 of the flip-flop 304. The clock input 310 is inverted such that a falling edge of the reference clock triggers the flip-flop 304. In other embodiments, the clock input 310 may not be inverted such that a rising edge of the reference clock triggers the flip-flop 304.

The latched value on the output 308 of the flip-flop 304 is an output of the metastability detector 300. In particular, the latched value at the output of the metastability detector 300 indicates metastability of the SAR ADC 200 at the time that the reference clock triggers the flip-flop 304. For example, the latched value at the output of the metastability detector 300 being a logical zero (which may also be referred to as a logic low) indicates that the comparator 204 has settled on a valid state when the flip-flop 304 had been triggered and the output of the metastability detector 300 being a logical one (which may also be referred to as a logic high) indicates that the comparator 204 has not settled on a valid state (i.e., is in a metastable state) when the flip-flop 304 had been triggered in some embodiments, such as when the metastability detector 300 includes the inverter 302.

Based on bit trials of the SAR ADC 200 being triggered by the ADC clock and the metastability determination of the metastability detector 300 being triggered by the reference clock, the time between the triggering of the bit trials and the detecting any metastability is less than a clock cycle of the ADC clock. In particular, the metastability detector 300 can detect whether the SAR ADC 200 has settled on a valid bit value at an edge of the reference clock that occurs between a first edge of the ADC clock transitioning in a certain direction that triggers a bit trial and a subsequent edge of the ADC clock transitioning in the same direction. The edge of the reference clock may occur at a predetermined time after the first edge of the ADC clock. The ability to detect the metastability in less than a clock cycle of the ADC clock can help to avoid issues that may occur due to prolonged metastability of the SAR ADC 200.

Figure 4:
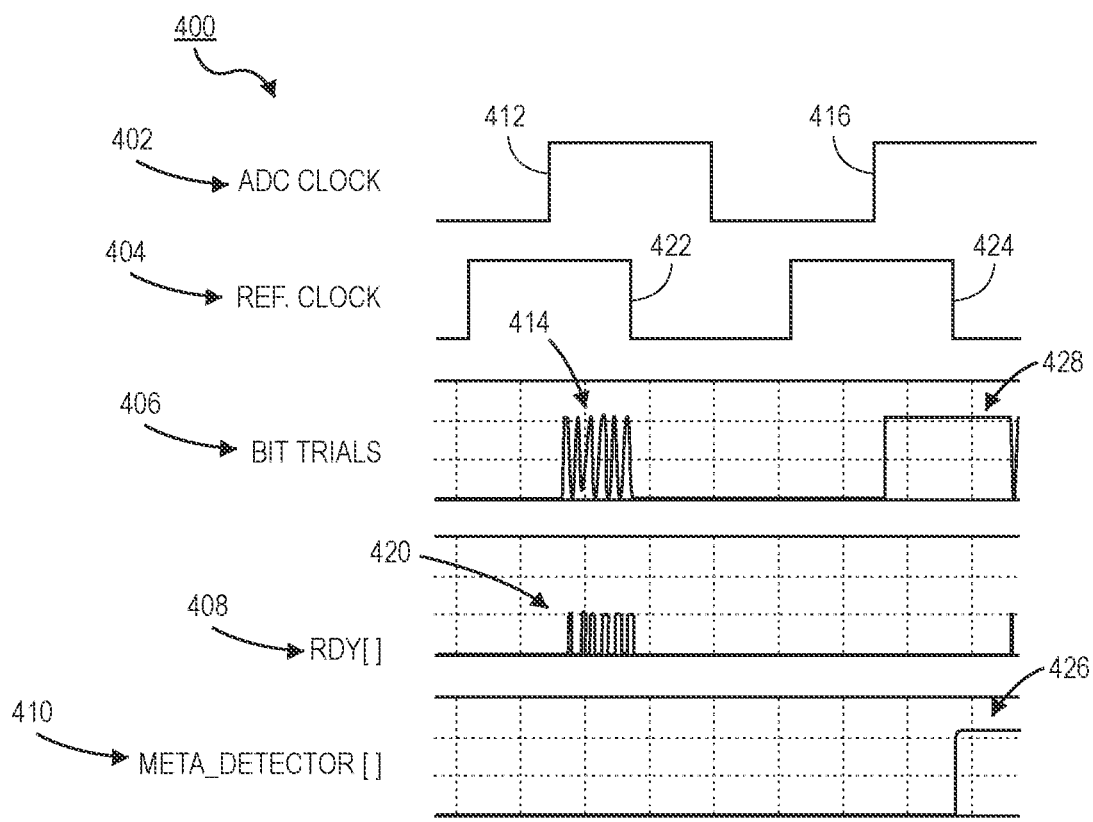
FIG. 4 shows a timing diagram illustrating functionality of a metastability detector, according to some embodiments of the disclosure.

FIG. 4 shows a timing diagram 400 illustrating functionality of a metastability detector, according to some embodiments of the disclosure. In particular, the timing diagram 400 includes an ADC clock timing signal 402 and a reference clock timing signal 404. The ADC clock timing signal 402 is provided to the SAR ADC 200 (FIG. 2; in particular, to the comparator 204 (FIG. 2)) and the rising edge causes initiation of bit conversions by the SAR ADC 200. The reference clock timing signal 404 is provided to the metastability detector 300 (FIG. 3; in particular, to the flip-flop 304 (FIG. 3)) and triggers metastability detection by the metastability detector 300.

The timing diagram 400 further includes a bit trial signal 406. The bit trial signal 406 indicates when bit trials are being performed by the comparator 204 (i.e., when the comparator 204 is attempting to settle on a valid bit value). In particular, the bit trial signal 406 indicates when the comparator 204 is trying to settle on a valid bit value when the bit trial signal 406 is high and indicates when the comparator 204 has settled on a valid bit value and/or is not performing a bit trial when the bit trial signal 406 is low.

The timing diagram 400 further includes a ready signal 408. The ready signal 408 illustrates a signal that can be output by the SAR logic 206 (FIG. 2) of the SAR ADC 200 on the RDY 224 (FIG. 2). The ready signal 408 indicates when a bit trial has been completed (i.e., the comparator 204 has settled on a valid bit value). In particular, the ready signal 408 indicates that the comparator 204 has settled on a valid bit value when the ready signal 408 is high and indicates that the comparator 204 has not settled on a valid bit value and/or is not performing a bit trial when the ready signal 408 is low.

The timing diagram 400 further includes a metastability detector signal 410. The metastability detector signal 410 illustrates a signal that can be output by the metastability detector 300 on the output 308 (FIG. 3). The metastability detector signal 410 indicates when the SAR ADC 200 is in a metastable state at a time of metastability detection. In particular, the metastability detector signal 410 indicates that the SAR ADC 200 has detected that SAR ADC 200 is in a metastable state when the flip-flop 304 (FIG. 3) was last triggered when the metastability detector signal 410 is high and that the metastability detector 300 did not detect metastability when the flip-flop 304 was last triggered when the metastability detector signal 410 is low.

In the illustrated embodiment, the ADC clock timing signal 402 and the reference clock timing signal 404 have a common frequency, but are offset by approximately a quarter of a clock cycle. In particular, the ADC clock timing signal 402 trails the reference clock timing signal 404 by approximately a quarter of a clock cycle. In other embodiments, the amount of offset may differ from the quarter of the clock cycle. The amount of offset of the ADC clock timing signal 402 and the reference clock timing signal 404 may define an amount of time for the comparator 204 to settle on a valid bit value. In some embodiments, the amount of offset may be programmable to fit a desired application.

The ADC clock timing signal 402 can trigger bit trials to be performed by the comparator 204. In the illustrated embodiment, rising edges of the ADC clock timing signal 402 triggers bit trials to be performed by the comparator 204. In particular, a first rising edge 412 of the ADC clock timing signal 402 triggers a first group of bit trials 414 and a second rising edge 416 of the ADC clock timing signal 402 triggers a second group of bit trials 418. Based on the groups of bit trials, the ready signal 408 indicates when the individual bit trials have completed. In particular, the ready signal 408 has a group of ready indications 420 corresponding to the first group of bit trials 414, where the ready indications occur in response to the bit trials transitioning from high to low, which indicates that the comparator 204 has settled on a valid bit value for a bit trial. As the second group of bit trials 418 fails to transition from high to low, the ready signal 408 does not have ready indications corresponding to the second group of bit trials 418.

The reference clock timing signal 404 can trigger metastability detection to be performed by the metastability detector 300. In the illustrated embodiment, falling edges of the reference clock timing signal 404 triggers metastability detection to be performed by the metastability detector 300. When the metastability detector 300 is triggered the metastability detector 300 checks the ready signal 408 for ready indication at the trigger time. In particular, the metastability detector 300 checks whether the ready signal 408 is high at the trigger. If the ready signal 408 is high, the metastability detector 300 determines that the comparator 204 has settled on a valid bit value (i.e., is not in a metastable state) and the metastability detector 300 determines that the comparator 204 has not settled on a valid bit value (i.e., is in a metastable state) if the ready signal 408 is low. The bit trial at which the metastability is checked can be programmable in some embodiments.

In the illustrated embodiment, the metastability detector 300 is triggered at a first falling edge 422 of the reference clock timing signal 404 and checks the ready signal 408 for a ready indication (i.e., the ready signal 408 being high) when triggered. The metastability detector 300 detects one of the ready indications of the group of ready indications 420 that appears concurrently with the metastability detector 300 being triggered and determines that the comparator 204 has settled on a valid bit value (i.e., is not in a metastable state) based on the ready indication. Based on the metastability detector 300 determining that the comparator 204 has settled on a valid bit value, the metastability detector 300 maintains the metastability detector signal 410 in a low state to indicate that metastability was not detected by the metastability detector 300.

The metastability detector 300 is further triggered at a second falling edge 424 of the reference clock timing signal 404 in the illustrated embodiment. The metastability detector 300 checks the ready signal 408 for a ready indication (i.e., the ready signal 408 being high) when triggered. The metastability detector 300 detects the absence of the ready indication (i.e., the ready signal 408 being low) at the time the metastability detector 300 is triggered and determines that comparator 204 has not settled on a valid bit value (i.e., is in a metastable state) based on the absence of the ready indication. Based on the metastability detector 300 determining that the comparator 204 has not settled on a valid bit value, the metastability detector 300 transitions the metastability detector signal 410 to a high state (as illustrated by high portion 426 of the metastability detector signal 410) to indicate that metastability was detected by the metastability detector 300.

Various options are available for a metastability detector. In some cases, there is programmability for which bit trial metastability is detected. In some cases, there is programmability to have all or some of the bits checked for metastability. In some cases, selection for which bit is checked can be implemented as combinational logic before or after detection for each bit. In some cases, the reference clock can be generated locally or can be a global input to the ADC. In some cases, there is programmability of the duration over which metastability is checked.

After metastability has been detected by the metastability detector 300, the metastability detector signal 410 may remain in the high state indicating that metastability has been detected until an occurrence of an event that causes the metastability detector 300 to be reset. In some embodiments, the event that causes the metastability detector 300 to be reset comprises the occurrence of a rising edge of the ADC clock timing signal 402. In other embodiments, the event that causes the metastability detector 300 to be reset comprises the completion of a subsequent bit trial with the ready signal 408 indicating that the comparator 204 is no longer in a metastable state.

Figure 5:
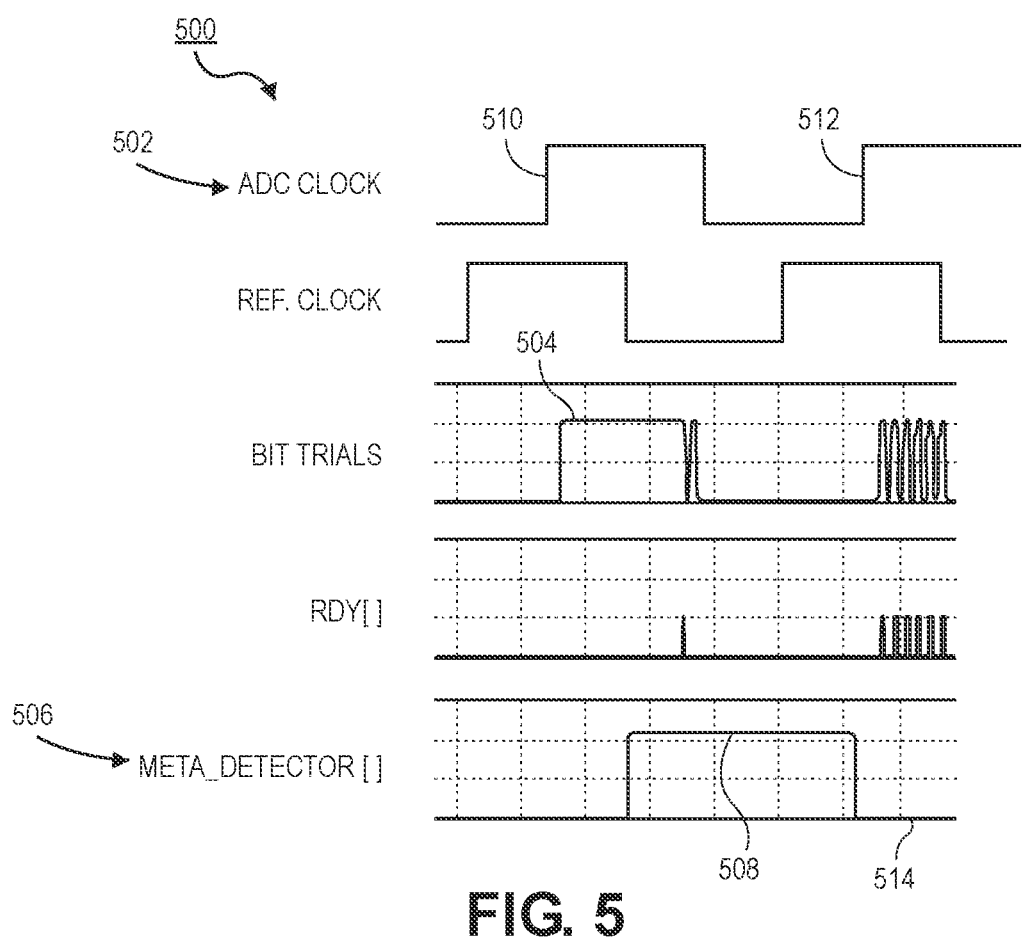
FIG. 5 shows a timing diagram illustrating functionality of a metastability detector, according to some embodiments of the disclosure.

FIG. 5 shows a timing diagram 500 illustrating functionality of a metastability detector, according to some embodiments of the disclosure. In particular, the timing diagram 500 illustrates an embodiment of the metastability detector 300 (FIG. 3) that is reset on the occurrence of a rising edge of an ADC clock of the metastability detector 300. In other embodiments, the metastability detector 300 can be reset via an external trigger. The external trigger may be synchronous to the ADC clock or can be asynchronous to the ADC clock.

In the illustrated embodiment, the metastability detector 300 detected that a first group of bit trials 504 caused the comparator 204 (FIG. 2) to enter a metastable state. The first group of bit trials 504 was triggered by a first rising edge 510 of the ADC clock timing signal 502. In response to the metastability detector 300 detecting the comparator 204 entering the metastable state, the metastability detector 300 caused a metastability detector signal 506 to go high (as illustrated by high portion 508 of the metastability detector signal 506) to indicate that metastability has been detected. The metastability detector signal 506 may be maintained in the high state, thereby indicating that metastability has been detected, after detection of the metastable state.

While the metastability detector signal 506 is in the high state, a second rising edge 512 of the ADC clock timing signal 502 occurs, the second rising edge 512 being subsequent to the first rising edge 510. In the illustrated embodiment, the second rising edge 512 causes the metastability detector 300 to be reset. Resetting the metastability detector 300 causes the metastability detector signal 506 to transition to a low state (as illustrated by low portion 514 of the metastability detector signal 506), thereby resetting the metastability detector signal 506 to indicate that metastability has not been detected and the metastability detector 300 begins monitoring again for further instances of metastability. Once the metastability detector 300 has been reset, the metastability detector 300 can monitor for metastability of groups of bit trials occurring subsequent to the metastability detector 300 being reset.

Figure 6:
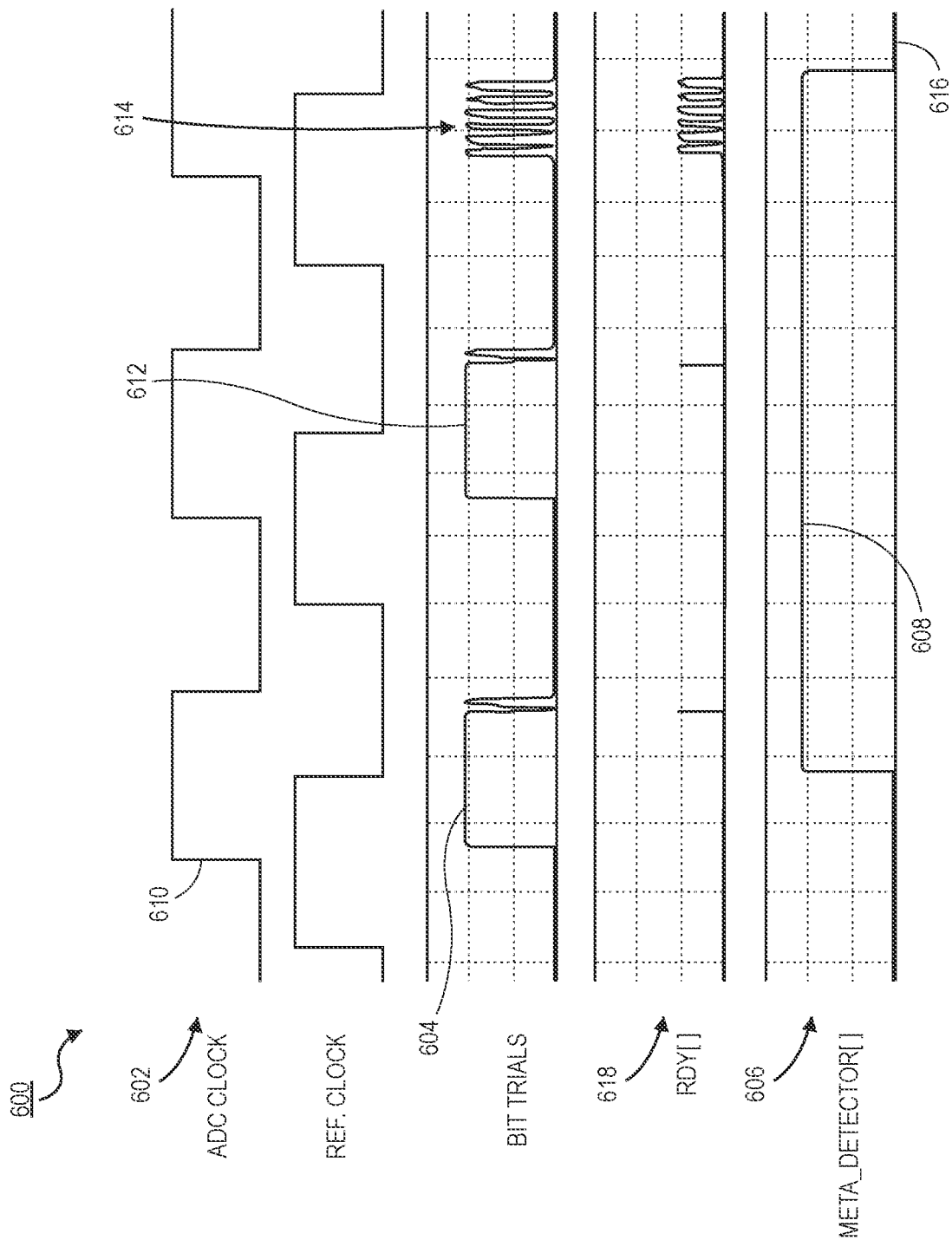
FIG. 6 shows a timing diagram illustrating functionality of a metastability detector, according to some embodiments of the disclosure.

FIG. 6 shows a timing diagram 600 illustrating functionality of a metastability detector, according to some embodiments of the disclosure. In particular, the timing diagram 600 illustrates an embodiment of the metastability detector 300 (FIG. 3) that is reset on the occurrence of completion of a group of bit trials without metastability.

In the illustrated embodiment, the metastability detector 300 detected that a first group of bit trials 604 caused the comparator 204 (FIG. 2) to enter a metastable state. The first group of bit trials 604 was triggered by a rising edge 610 of the ADC clock timing signal 602. In response to the metastability detector 300 detecting the comparator 204 entering the metastable state, the metastability detector 300 caused a metastability detector signal 606 to go high (as illustrated by high portion 608 of the metastability detector signal 606) to indicate that metastability has been detected. The metastability detector signal 606 may be maintained in the high state after detection of the metastable state.

The metastability detector signal 606 can be maintained in the high state, thereby indicating that metastability has been detected, until a conversion of a group of bit trials is completed without entering a metastable state. In the illustrated embodiment, the comparator 204 entered a metastable state during conversion of a second group of bit trials 612, the second group of bit trials 612 occurring subsequent to the first group of bit trials 604 that caused the metastability detector signal 606 to initially go high, thereby indicating that metastability has been detected. Due to the second group of bit trials 612 causing the comparator 204 to enter a metastable state, the metastability detector signal 606 remains high after the second group of bit trials 612. The comparator 204 completes a third group of bit trials 614 without entering a metastable state, the third group of bit trials 614 occurring subsequent to the first group of bit trials 604 and the second group of bit trials 612. A ready signal 618 can indicate that the third group of bit trials 614 did not cause the comparator 204 to enter a metastable state. In response to the third group of bit trials 614 being converted without a metastable state being entered, the metastability detector 300 may be reset and the metastability detector signal 606 may go low (as illustrated by low portion 616 of the metastability detector signal 606), thereby indicating that metastability has not been detected and the metastability detector 300 begins monitoring again for further instances of metastability. The metastability detector signal 606 may monitor metastability of groups of bit trials occurring subsequent to the metastability detector 300 being reset.

Metastability Compensation

Figure 7:
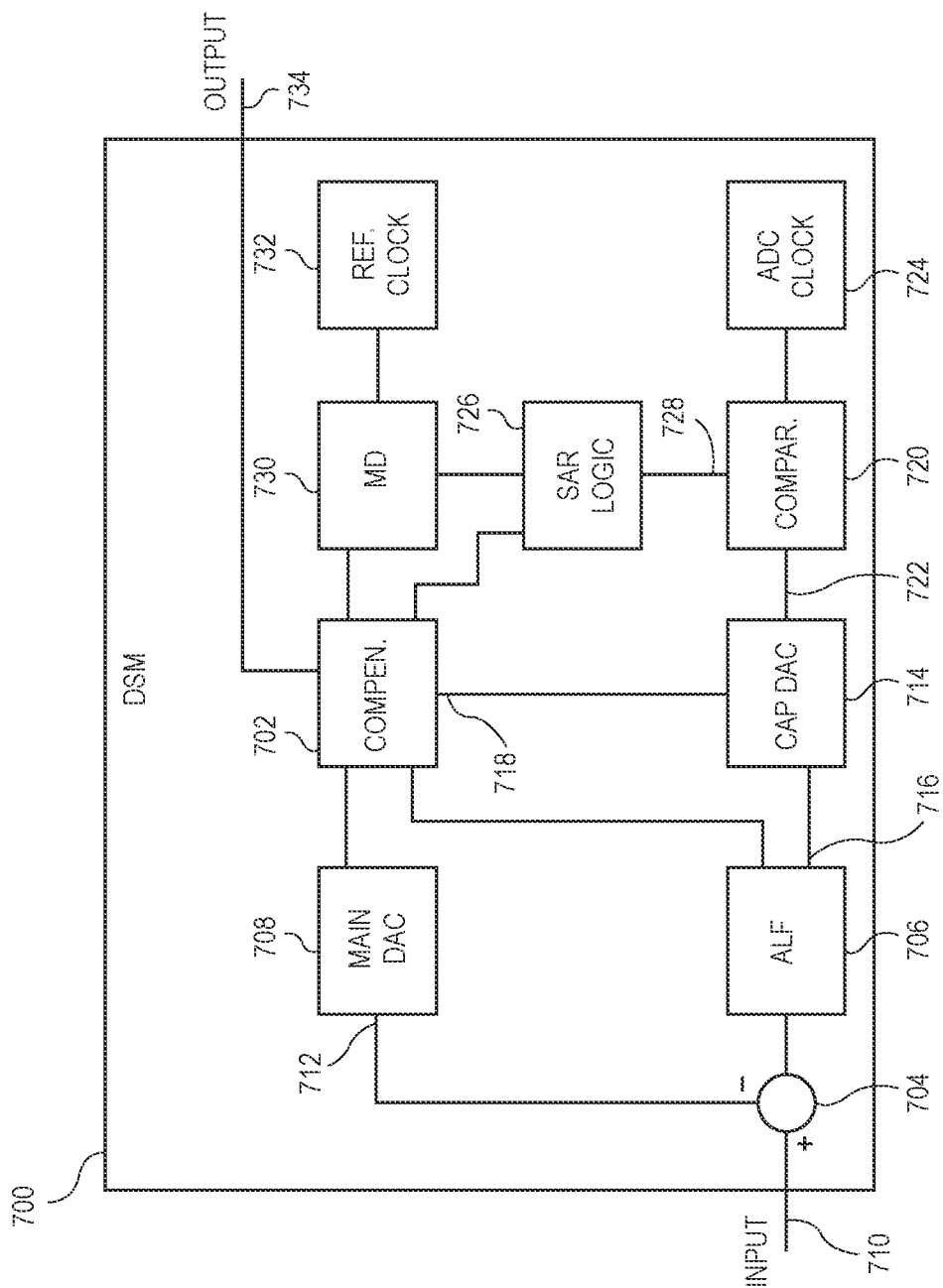
FIG. 7 shows another example DSM loop, according to some embodiments of the disclosure.

As metastability of a SAR ADC within a DSM loop can cause errors within the DSM loop, it can be beneficial to compensate for detected metastability of the SAR ADC. To compensate for detected metastability, a DSM loop can include a metastability compensator that can implement one or more compensation schemes. FIG. 7 shows another example DSM loop 700, according to some embodiments of the disclosure. In particular, the DSM loop 700 includes compensator circuitry 702 (which can also be referred to as "a metastability compensator") that can implement one or more compensation schemes.

The DSM loop 700 includes a summation node 704, an analog loop filter 706, and a main DAC 708. The summation node 704 includes one or more of the features of the summation node 102 (FIG. 1). Further, the analog loop filter 706 includes one or more of the features of the analog loop filter 104 (FIG. 1). The main DAC 708 includes one or more of the features of the main DAC 108 (FIG. 1). In some embodiments, the summation node 704, the analog loop filter 706, and the main DAC 708 may be the same as the summation node 102, the analog loop filter 104, and the main DAC 108, respectively, without modification. The summation node 704 is coupled to an input 710 of the DSM loop 700 and an output 712 of the main DAC 708, and provides the result of subtracting a signal on the output 712 from a signal on the input 710.

The DSM loop 700 further includes a CAP DAC 714. The CAP DAC 714 includes one or more of the features of the CAP DAC 202 (FIG. 2). The CAP DAC 714 is coupled to an output 716 of the analog loop filter 706 and an output 718 of the compensator circuitry 702. The CAP DAC 714 samples signals provided on the output 716, such as the CAP DAC 202 samples signals on the inputs 208 (FIG. 2) and redistributes charge for SAR bit trials. Further, signals on the output 718 of the compensator circuitry 702 control the sampling being performed by the CAP DAC 714, such as the first comparison output 220 (FIG. 2) and the second comparison output 222 (FIG. 2) control the sampling by the CAP DAC 202. The output 718 can be single ended or differential in nature.

The DSM loop 700 further includes a comparator 720. The comparator 720 includes one or more of the features of the comparator 204 (FIG. 2). The comparator 720 is coupled to an output 722 of the CAP DAC 714. The comparator 720 compares signals received on the output 722 of the CAP DAC 714.

The DSM loop 700 further includes an ADC clock 724. The ADC clock 724 generates a clock signal, such as the ADC clock timing signal 402 (FIG. 4). The ADC clock 724 is coupled to the comparator 720 and provides the clock signal to the comparator 720. The clock signal provided by the ADC clock 724 triggers the comparator 720 to start performing comparisons of signals input to the comparator via the output 722, such as comparisons performed in bit trials. The comparator 720 may be triggered on rising edges of the clock signal provided by the ADC clock 724.

The DSM loop 700 further includes SAR logic 726. The SAR logic 726 includes one or more of the features of the SAR logic 206 (FIG. 2). The SAR logic 726 is coupled to an output 728 of the comparator 720. The SAR logic 726 receives output signals (such as the outputs 214 (FIG. 2)) and CRDY signals (such as the CRDY 216 (FIG. 2)) from the comparator 720 and latches the output signals and the CRDY signals.

The DSM loop 700 further includes a metastability detector 730. The metastability detector 730 includes one or more of the features of the metastability detector 300 (FIG. 3). The metastability detector 730 is coupled to the SAR logic 726 and receives a ready signal (such as RDY 224 (FIG. 2)) from the SAR logic 726 that is utilized by the metastability detector 730 to detect metastability of the comparator 720. The CAP DAC 714, the comparator 720, the SAR logic 726, and the metastability detector 730 may comprise a SAR ADC, such as the SAR ADC 200 (FIG. 2).

The DSM loop 700 includes a reference clock 732. The reference clock 732 may generate a clock signal, such as the reference clock timing signal 404 (FIG. 4). The clock signal produced by the reference clock 732 may be a same frequency as and offset from the clock signal produced by the ADC clock 724. For example, the clock signal produced by the reference clock 732 may be offset by a quarter of a clock cycle in some embodiments. In other embodiments, the reference clock 732 may include circuitry coupled to the ADC clock 724, where the clock signal produced by the reference clock 732 is derived from the clock signal produced by the ADC clock 724. The reference clock 732 is coupled to the metastability detector 730 and provides the clock signal produced by the reference clock 732 to the metastability detector 730, where the clock signal triggers metastability detector 730 to detect whether the comparator 720 is in a metastable state. In particular, falling edges of the clock signal may trigger the metastability detector 730 in some embodiments.

The DSM loop 700 further includes the compensator circuitry 702. The compensator circuitry 702 is coupled to the SAR logic 726 and the metastability detector 730. The compensator circuitry 702 receives the latched comparison output signals (such as the first comparison output 220 (FIG. 2) and the second comparison output 222 (FIG. 2)) from the SAR logic 726. The compensator circuitry 702 may store results of certain bit trials, results of all the bit trials, samples (i.e., resultant values of completed conversions of a value input into the CAP DAC 714) produced by conversion processes of the SAR ADC, or some combination thereof. The compensator circuitry 702 further receives the output of the metastability detector 730 (such as the output 308 (FIG. 3) of the metastability detector 300). Depending on whether the output of metastability detector 730 indicates that metastability has been detected, the compensator circuitry 702 determines whether a compensation scheme should be implemented.

The compensator circuitry 702 is further coupled to the main DAC 708, the analog loop filter 706, the CAP DAC 714, and/or an output 734 of the DSM loop 700. The compensator circuitry 702 can output values to the main DAC 708, the analog loop filter 706, and/or the CAP DAC 714 to implement one or more of the compensation schemes. For example, the compensator circuitry 702 can output the latched comparison signals to the main DAC 708, the analog loop filter 706 and/or the CAP DAC 714 to complete conversions. Further, the compensator circuitry 702 can output results of a conversion on the output 734.

The compensator circuitry 702 can perform compensation on the received results of the bit trials and/or the received samples. The compensation scheme to be implemented may be programmable to allow the compensator circuitry 702 to apply the desired compensation scheme for the application in which the DSM loop 700 is implemented.

In one possible compensation scheme that can be implemented by the compensator circuitry 702, the compensator circuitry 702 can output the last valid data captured by the compensator circuitry 702 in response to metastability being detected. The last valid data can be the last sample received and stored by the compensator circuitry 702 when the output received from the metastability detector 730 indicates that metastability was not detected. In particular, the compensator circuitry 702 stores the last prior valid data in place of the sample received by the compensator circuitry 702 for which the metastability detector 730 indicated that one or more of the bit trials of the sample presented metastability. After placing the last prior valid data in place of the sample, the compensator circuitry 702 may wait for the next ADC conversion cycle prior to performing further compensation.

In another possible compensation scheme that can be implemented by the compensator circuitry 702, the compensator circuitry 702 can output an average value, or other statistically derived value, based on a certain number of the prior valid samples. In some embodiments, the number of prior valid samples may be defined to be between two and five samples, although the number of prior valid samples may be different in other embodiments. In particular, the compensator circuitry 702 may average a defined number of prior valid samples stored last by the compensator circuitry 702 and store the average in place of the sample received by the compensator circuitry 702 for which the metastability detector 730 indicated that one or more bit trials of the sample presented metastability in some embodiments. After placing the average, or the other statistically derived value in place of the sample, the compensator circuitry 702 may wait for the next ADC conversion cycle prior to performing further compensation.

In another possible compensation scheme that can be implemented by the compensator circuitry 702, the compensator circuitry 702 can place a predefined bit value (a logic zero or logic one) for a bit corresponding to a bit trial where metastability was detected by the metastability detector 730. In particular, the compensator circuitry 702 can store the predefined bit value in place of a bit corresponding to a bit trial where metastability was detected and continue with subsequent bit trials. The compensator circuitry 702 can continue the ADC conversion with the predefined bit value inserted in place of the bit and output the sample with the predefined bit value. The compensator circuitry 702 can further use redundancy to compensate for any subsequent bit trials where metastability is detected.

In another possible compensation scheme that can be implemented by the compensator circuitry 702, the compensator circuitry 702 can place the bit value from the preceding sample for a bit corresponding to a bit trial where metastability was detected by the metastability detector 730. In particular, the compensator circuitry 702 can store the corresponding bit value from the preceding sample in place of a bit corresponding to the bit trial where metastability was detected by the metastability detector 730 and continue with subsequent bit trials. The compensator circuitry 702 can continue the ADC conversion with the bit value from the preceding sample inserted in place of the bit corresponding to the bit trial where metastability was detected and output the sample with the corresponding bit in the place. The compensator circuitry 702 can further use redundancy to compensate for any subsequent bit trials where metastability is detected.

For an example of the compensation scheme using the bit value from the preceding sample, a current sample conversion may have completed converting a first two most significant bits of the current sample producing a value of "01." When converting the third most significant bit of the bit trial, metastability may be detected. The preceding sample may have produced the value of "101100," which may have been stored by the compensator circuitry 702. In response to detecting the metastability, the compensator circuitry 702 identifies the value of the third most significant bit of the preceding sample, which is "1" in the instance. The compensator circuitry 702 places the value of the third most significant bit of the preceding sample in the third most significant bit position of the current sample conversion, producing the value of "011." The current sample conversion may continue the conversion with the fourth most significant bit, adding the fourth most significant bit value to the fourth most significant bit position of the value of "011."

In another possible compensation scheme that can be implemented by the compensator circuitry 702, the compensator circuitry 702 can store a truncated value of a preceding sample for the current sample where metastability was detected. In particular, the compensator circuitry 702 can store the corresponding bits from the preceding sample for the bit trial where metastability occurred and the prior completed bit trials of the current sample. The compensator circuitry 702 can then apply the truncated value to the CAP DAC 714 and continue with the remaining bit trials to complete conversion of the current sample. The compensator circuitry 702 can further use redundancy to compensate for any subsequent bit trials where metastability is detected.

For an example of the compensation scheme using the truncated value from the preceding sample, a current sample conversion may have metastability detected at bit trial for a fourth most significant bit of the current sample. The preceding sample may have produced the value of "101100," which may have been stored by the compensator circuitry 702. In response to detecting the metastability at the bit trial for the fourth most significant bit, the compensator circuitry 702 identifies a truncated value with the four most significant bits from the preceding sample, which is "1011" in this instance. The compensator circuitry 702 applies the truncated value of "1011" to the CAP DAC 714 and continues with the remaining bit trials for the current sample to complete conversion of the current sample.

Figure 8:
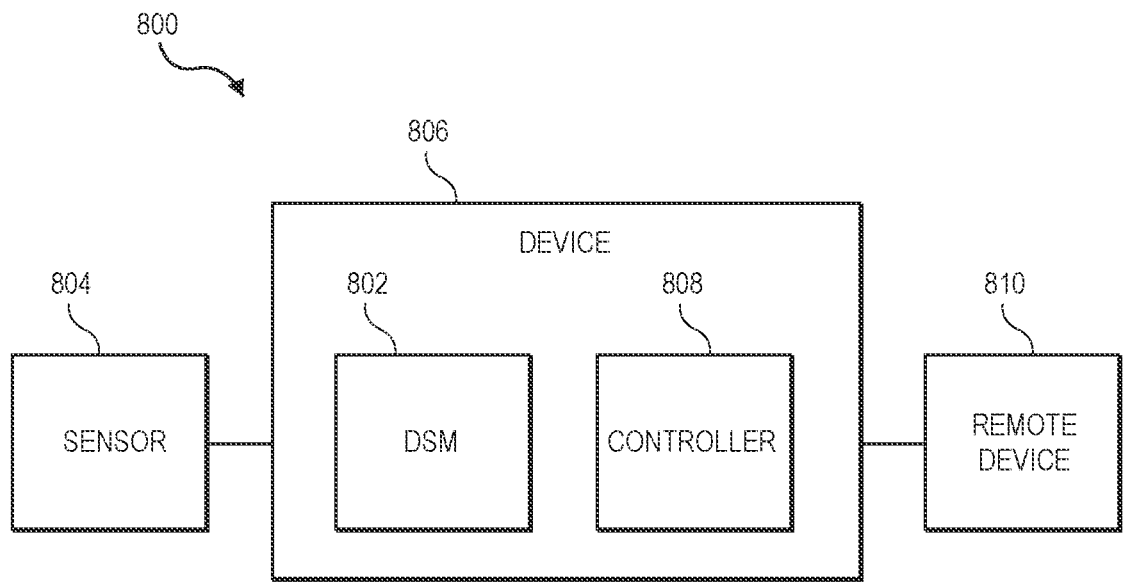
FIG. 8 shows an example system that implements a DSM loop, according to some embodiments of the disclosure.

FIG. 8 shows an example system 800 that implements a DSM loop 802, according to some embodiments of the disclosure. In particular, the system 800 can implement the DSM loop 100 (FIG. 1), the DSM loop 700 (FIG. 7), or some combination, as the DSM loop 802. Further, the DSM loop 802 can include a metastability detector (such as the metastability detector 300 (FIG. 3) and/or the metastability detector 730 (FIG. 7)) and/or compensator circuitry (such as the compensator circuitry 702 (FIG. 7)). In some embodiments, the system 800 may comprise a sensing device, such as a low-power sensing device.

The system 800 includes a sensor 804. The sensor 804 senses some characteristic and outputs an analog signal that indicates a value of the characteristic. For example, some characteristics that the sensor 804 may be configured to sense includes temperature, force, sound, and/or light. It is to be understood that the characteristics listed are intended to be non-limiting and other characteristics can be sensed by the sensor 804 in other implementations.

The system 800 further includes a device 806. The device 806 is coupled to the sensor 804. The device 806 manages communication with the sensor 804 and converts the analog signal produced by the sensor 804 to a digital signal for transmission and/or processing. The device 806 includes the DSM loop 802. The DSM loop 802 includes one or more of the features of the DSM loop 100 and/or the DSM loop 700. The DSM loop 802 may receive the analog signal from the sensor 804 and produce a digital signal from the analog signal.

The device 806 further includes a controller 808. The controller 808 can control communication with the device 806, such as receiving the analog signal from the sensor 804 and providing the digital signal produced by the DSM loop 802 to other devices. The controller 808 can further control conversion by the DSM loop 802, such controlling the analog signal being provided to the DSM loop 802. The controller 808 may comprise a system-on-chip, a processor, circuitry, or some combination thereof. In some embodiments, the controller 808 can include or can interact with communication circuitry (such as wireless communication circuitry and/or wired communication circuitry) to facilitate communication with the device 806.

The system 800 further includes a remote device 810. The remote device 810 is coupled to the device 806. The remote device 810 can receive the digital signal produced by the DSM loop 802 from the device 806, and perform digital signal processing and/or analyze the digital signal. In some embodiments, the remote device 810 may comprise a computer device with a processor and can process the digital signal received from the device 806.

While the sensor 804, the device 806, and the remote device 810 are illustrated as three separate devices in the illustrated embodiment, it is to be understood that one or more of the sensor 804, the device 806, and the remote device 810 may be included within a single device in other embodiments. For example, the sensor 804 and the device 806 may be included within a single device in some embodiments, such as being included within a probe. Further, the device 806 and the remote device 810 may be included in a single device in other embodiments. Additionally, the sensor 804, the device 806, and the remote device 810 may be included in a single, stand-alone device in other embodiments, such as being included within a smart phone.

Figure 9:
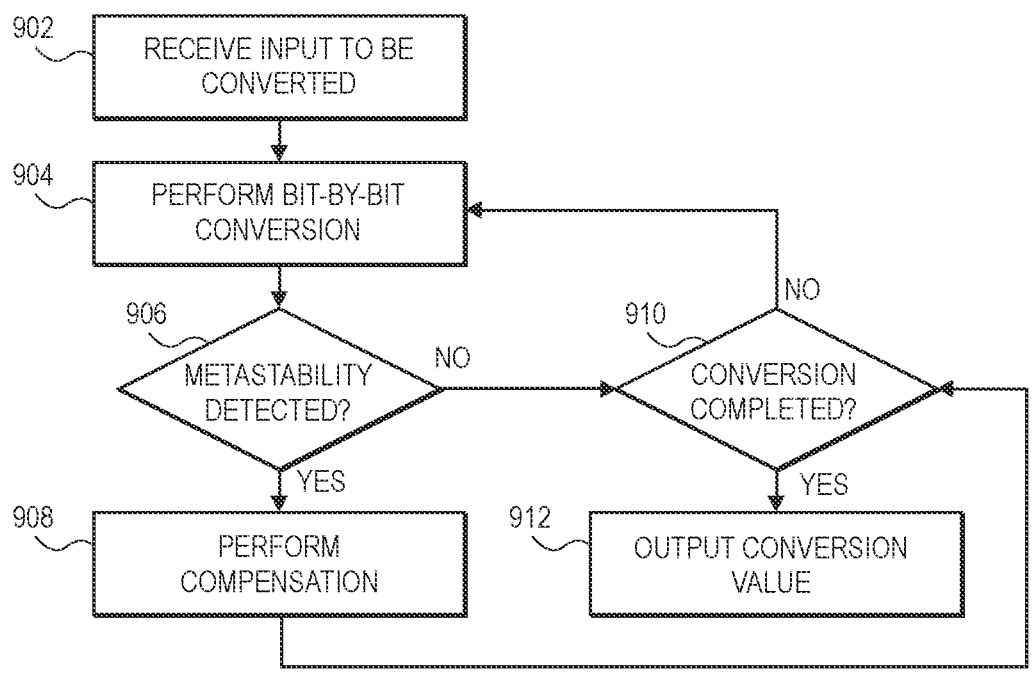
FIG. 9 shows an example procedure that may be performed by DSM loop, according to some embodiments of the disclosure.

FIG. 9 shows an example procedure 900 that may be performed by DSM loop, according to some embodiments of the disclosure. In particular, the procedure 900 may be performed by the DSM loop 100 (FIG. 1), the DSM loop 700 (FIG. 7), the DSM loop 802 (FIG. 8), or some combination thereof.

The procedure 900 initiates with the DSM loop receiving input to be converted in stage 902. In particular, the DSM loop receives an analog signal to be converted to a digital signal.

In stage 904, the DSM loop performs a bit-by-bit conversion on the analog signal received in stage 902. In particular, the DSM loop can perform a plurality of bit trials for a sample to produce a digital signal.

In stage 906, the DSM loop determines whether metastability was detected. In particular, a metastability detector (such as the metastability detector 300 (FIG. 3) and/or the metastability detector 730 (FIG. 7)) determines whether metastability has been detected. The DSM loop can determine whether metastability has been detected for each bit trial, for certain bit trials that the DSM is programmed to check for metastability, and/or at the completion of the sample. If metastability is detected, the procedure 900 proceeds to stage 908. If metastability is not detected, the procedure 900 proceeds to stage 910.

In stage 908, the DSM loop performs compensation in response to detecting metastability. In particular, compensator circuitry (such as the compensator circuitry 702 (FIG. 7)) of the DSM loop may perform one or more of the compensation schemes described in relation to FIG. 7. After completion of the compensation in stage 908, the procedure 900 proceeds to stage 910.

In stage 910, the DSM loop determines whether the conversion has been completed. In particular, the DSM loop determines whether there are further bit trials to be performed to complete the conversion of the sample. If the DSM loop determines that the conversion has not been completed, the procedure 900 proceeds to stage 904 to perform the remaining bit trials in sample. In instances where compensation has been performed, the bit trials can proceed with the value produced by the compensation. In other instances where compensation has not been performed, the bit trials can proceed with the uncompensated value. If the DSM loop determines that the conversion has been completed, the procedure 900 proceeds to stage 912.

In stage 912, the DSM loop outputs the converted value. In particular, the DSM loop outputs the digital signal that results from the conversion by the DSM loop. The value outputted by the DSM loop can be a compensated digital signal when compensation has been performed or an uncompensated digital signal when compensation has not been performed.

Figure 10:
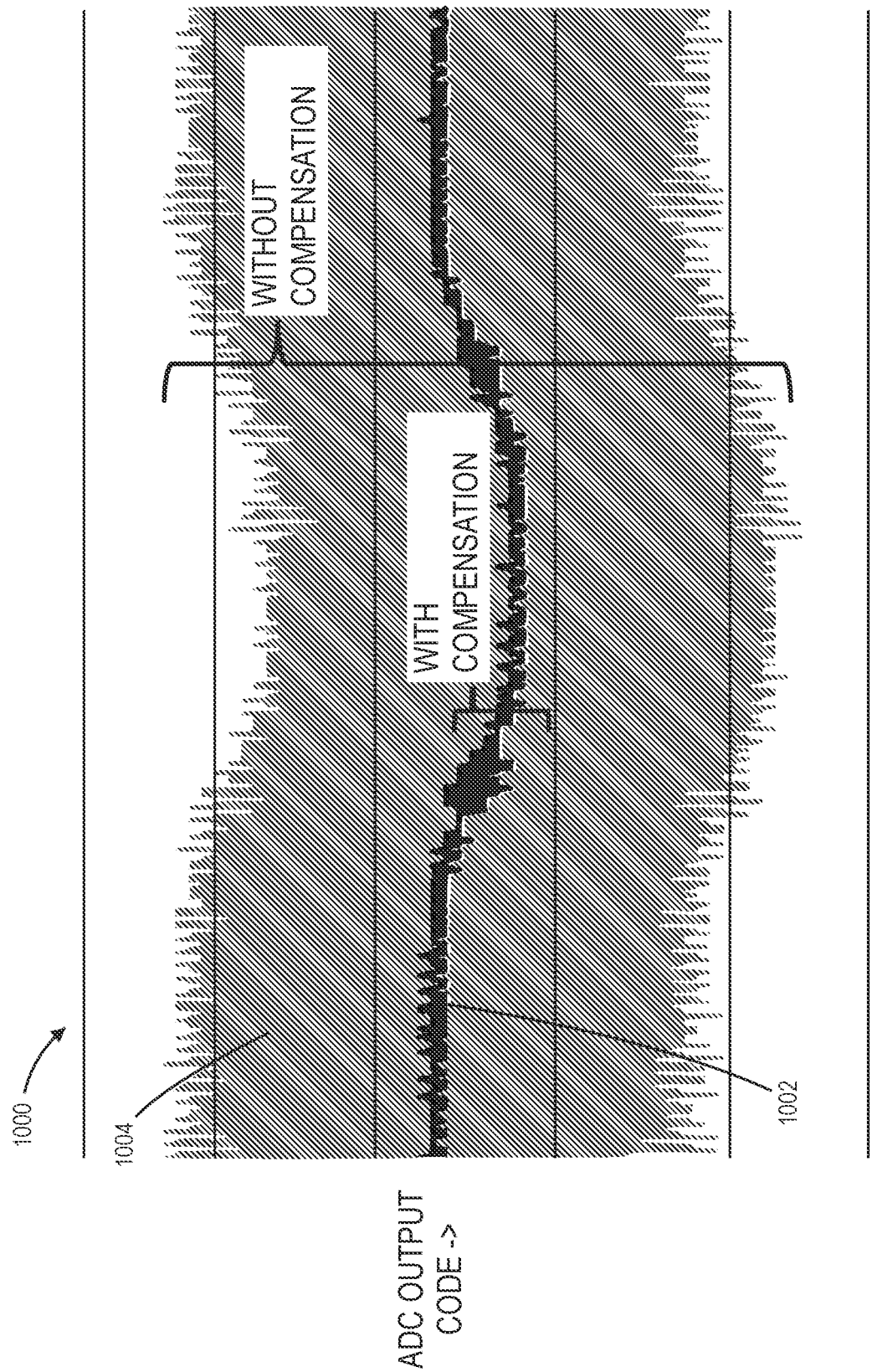
FIG. 10 shows a chart of signals produced by DSM loops, according to some embodiments of the disclosure.

FIG. 10 shows a chart 1000 of signals produced by DSM loops, according to some embodiments of the disclosure. In particular, the chart 1000 shows measured data for a square wave input to a SAR ADC, such as the SAR ADC 200 (FIG. 2), and/or the elements of the DSM loop 700 (FIG. 7) that form a SAR ADC (e.g. the CAP DAC 714 (FIG. 7), the comparator 720 (FIG. 7), the SAR logic 726 (FIG. 7), the metastability detector 730 (FIG. 7), and/or the compensator circuitry 702 (FIG. 7)).

A first signal 1002 illustrates a signal produced by a DSM loop with compensation, whereas a second signal 1004 illustrates a signal produced by a DSM loop without compensation. For example, the DSM loop that produced the first signal 1002 includes compensator circuitry (such as the compensator circuitry 702 (FIG. 7)), whereas the DSM loop that produced the second signal 1004 does not include compensator circuitry. The first signal 1002 is overlaid the second signal 1004 to illustrate the difference between the signals. As can be seen, the first signal 1002 does not have the oscillatory behavior displayed by the second signal 1004, which indicates that the delta sigma loop has gone unstable and is not able to perform the required analog-to-digital conversion. Without the oscillatory behavior, the first signal 1002 displays less noise than the second signal 1004, and the loop is stable and can perform the required analog-to-digital conversion.

Advantages

DSM loops implementing the metastability detectors and compensator circuitry described throughout this disclosure can present one or more technical advantages over legacy DSM loops. The metastability detector and compensator circuitry can be used for any one of the bits, including the most significant bits and least significant bits. Further, the metastability detector does not add extra loading on the signal input into the SAR ADC. The metastability detector does not increase the time that the output of the compensator is in a metastable state, thereby not increasing the chance of the SAR ADC presenting improper operation due to metastability. Further, the metastability detector does not add additional comparator(s) to the SAR ADC. The metastability detector and compensator circuitry can be implemented efficiently, without adding significant power and area to the DSM loop. Further, the metastability detector and compensator circuitry do not add substantial delay to the feedback loop. The metastability detector and compensator circuitry do not cause instability for the feedback loop of the DSM loop.

Variations and Implementations

Note that the activities discussed above with reference to the FIGURES are applicable to any integrated circuits that involve processing analog signals and converting the analog signals into digital data using one or more ADCs involving comparators. Various embodiments can be applicable to medical systems, scientific instrumentation, wireless and wired communications systems, radar, industrial process control, audio and video equipment, instrumentation, and other systems which uses ADCs.

The present disclosure encompasses apparatuses which can perform the various methods described herein. Such apparatuses can include circuitry illustrated by the FIGURES and described herein. Parts of various apparatuses can include electronic circuitry to perform the functions described herein. The circuitry can operate in analog domain, digital domain, or in a mixed-signal domain. In some cases, one or more parts of the apparatus can be provided by a processor specially configured for carrying out the functions described herein (e.g., control-related functions, timing-related functions). In some cases that processor can be an on-chip processor with the ADC. The processor may include one or more application specific components, or may include programmable logic gates which are configured to carry out the functions describe herein. In some instances, the processor may be configured to carrying out the functions described herein by executing one or more instructions stored on one or more non-transitory computer media.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or examples described herein. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or examples described herein. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the FIGURES may be combined in various possible configurations, all of which are clearly within the broad scope of this Disclosure. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that the term "circuitry" is used throughout this disclosure. In some embodiments, the term "circuitry" can refer to electronic components coupled together (such as via wires and/or circuit boards), processors, circuit elements, system-on-chips, or some combination thereof.

EXAMPLES

Example 1 may include an apparatus for detecting metastability of a successive-approximation-register (SAR) analog-to-digital converter (ADC), comprising a reference clock, wherein a signal of the reference clock has a same frequency as and is offset from a signal of an ADC clock of the SAR ADC that triggers conversion by the SAR ADC, and a flip-flop coupled to the SAR ADC and the reference clock, wherein the flip-flop is configured to latch a value of a ready signal output by the SAR ADC when triggered by the signal of the reference clock and output an indication of whether metastability of the SAR ADC has been detected based on the latched value of the ready signal.

Example 2 may include the apparatus of example 1, wherein the flip-flop is triggered by an edge or state of the signal of the reference clock, and wherein a time from when the signal of the ADC clock triggers conversion by the SAR ADC to when the signal of the reference clock triggers the flip-flop is less than a time of a clock cycle of the ADC clock.

Example 3 may include the apparatus of example 1, further comprising compensator circuitry coupled to the flip-flop, wherein the compensator circuitry is configured to implement a compensation scheme in response to the flip-flop indicating that metastability of the SAR ADC has been detected.

Example 4 may include the apparatus of example 3, wherein the compensation scheme includes outputting, by the compensator circuitry, last valid data captured by the compensator circuitry prior to the flip-flop indicating that metastability of the SAR ADC has been detected.

Example 5 may include the apparatus of example 3, wherein the compensation scheme includes outputting, by the compensator circuitry, an average value of a certain number of prior valid samples captured by the compensator circuitry prior to the flip-flop indicating that metastability of the SAR ADC has been detected.

Example 6 may include the apparatus of example 3, wherein the compensation scheme includes storing a predefined bit value in place of a bit corresponding to a bit trial where the flip-flop indicates that metastability of the SAR ADC has been detected.

Example 7 may include the apparatus of example 3, wherein the compensation scheme includes storing a bit value from a preceding sample in place of a bit corresponding to a bit trial where the flip-flop indicates that metastability of the SAR ADC has been detected.

Example 8 may include the apparatus of example 3, wherein the compensation scheme includes storing a truncated value of a preceding sample for a current sample corresponding to the conversion for which the flip-flop indicates that metastability of the SAR ADC has been detected, and continuing the conversion with the truncated value.

Example 9 may include the apparatus of example 1, wherein the SAR ADC is an asynchronous ADC.

Example 10 may include a delta sigma modulator (DSM) loop, comprising an asynchronous successive-approximation-register (SAR) analog-to-digital converter (ADC), wherein conversion by the asynchronous SAR ADC is triggered by an ADC clock, and a metastability detector coupled to the asynchronous SAR ADC to receive a ready signal from the asynchronous SAR ADC, wherein the metastability detector is triggered by a reference clock and detects metastability of the asynchronous SAR ADC based on the ready signal in response to being triggered by the reference clock.

Example 11 may include the DSM loop of example 10, wherein a reference signal of the reference clock that triggers the metastability detector has a same frequency as, and is offset from, an ADC signal of the ADC clock that triggers the conversion by the asynchronous SAR ADC, and wherein the reference signal triggers the metastability detector within a clock cycle of the ADC signal.

Example 12 may include the DSM loop of example 11, wherein the metastability detector includes a flip-flop coupled to the SAR ADC to receive the ready signal, wherein an edge of the reference signal triggers the flip-flop to latch a value of the ready signal, and wherein an output of the flip-flop indicates whether metastability of the asynchronous SAR ADC has been detected.

Example 13 may include the DSM loop of example 10, further comprising compensator circuitry coupled to the metastability detector, wherein the compensator circuitry is to implement a compensation scheme in response to the metastability detector indicating that metastability of the asynchronous SAR ADC has been detected.

Example 14 may include the DSM loop of example 13, wherein the compensator circuitry is further coupled to the SAR ADC, and wherein the compensator circuitry outputs a resultant value produced by the compensation scheme to the SAR ADC to be utilized for further bit trials.

Example 15 may include the DSM loop of example 13, wherein the compensator circuitry is coupled to an output of the DSM loop, and wherein the compensator circuitry outputs a resultant value produced by the compensation scheme to the output of the DSM loop.

Example 16 may include the DSM loop of example 13, wherein the metastability detector is to indicate that metastability has been detected in response to detecting that the asynchronous SAR ADC is in a metastable state, and wherein the metastability detector is to reset in response to a subsequent edge or state of the ADC clock.

Example 17 may include the DSM loop of example 13, wherein the metastability detector is to indicate that metastability has been detected in response to detecting that the asynchronous SAR ADC is in a metastable state, and wherein the metastability detector is to reset in response to conversion of a subsequent sample without entering a metastable state.

Example 18 may include a method of detecting metastability of an asynchronous successive-approximation-register (SAR) analog-to-digital converter (ADC), comprising detecting, by a metastability detector, a falling edge of a reference signal produced by a reference clock, latching, by the metastability detector, a value of a ready signal of the SAR ADC in response to detecting the falling edge of the reference signal, and outputting, by the metastability detector, an indication of whether metastability of the SAR ADC has been detected based on the latched value of the ready signal.

Example 19 may include the method of example 18, further comprising detecting, by compensator circuitry coupled to the metastability detector, that the metastability detector has indicated that metastability of the SAR ADC has been detected, and implementing, by the compensator circuitry, a compensation scheme in response to detecting that the metastability detector has indicated that metastability of the SAR ADC has been detected.

Example 20 may include the method of example 19, wherein implementing the compensation scheme includes affecting a value output by the SAR ADC to compensate for the detected metastability of the SAR ADC.

Example 21 may include the method of example 18, wherein the indication of whether metastability of the SAR ADC has been detected indicates that metastability of the SAR ADC has been detected, and wherein the method further comprises detecting, by the metastability detector, a certain edge or state of an ADC clock for the SAR ADC, the certain edge or state occurring subsequent to the falling edge of the reference signal, and resetting, by the metastability detector, in response to detecting the certain edge or state of the ADC clock.

Example 22 may include the method of example 18, wherein the indication of whether metastability of the SAR ADC has been detected indicates that metastability of the SAR ADC has been detected, and wherein the method further comprises detecting, by the metastability detector, completion of a group of bit trials without entering a metastable state, the group of bit trials occurring after output of the indication of whether metastability of the SAR ADC has been detected, and resetting, by the metastability detector, in response to detecting the group of bit trials.

Example 23 may include the apparatus of example 1, further comprising an inverter coupled between the SAR ADC and the flip-flop, wherein the inverter inverts the value of the ready signal output by the SAR ADC.

Example 24 may include the apparatus of example 1, wherein the reference clock comprises circuitry coupled to the ADC clock, wherein the circuitry generates a signal of reference clock from a signal of the ADC clock.

Example 25 may include an apparatus for compensating for metastability of a successive-approximation-register (SAR) analog-to-digital converter (ADC), comprising a metastability detector couple to the SAR ADC, the metastability detector to detect the metastability of the SAR ADC and output an indication that metastability of the SAR ADC has been detected, and compensator circuitry coupled to the metastability detector, the compensator circuitry configured to implement a compensation scheme in response to the indication that metastability of the SAR ADC has been detected by the metastability detector.

Example 26 may include the apparatus of example 25, wherein the compensation scheme includes outputting, by the compensator circuitry, an average value of a certain number of prior valid samples captured by the compensator circuitry prior to the indication that metastability of the SAR ADC has been detected being output by the metastability detector.

Example 27 may include the apparatus of example 26, wherein the certain number of prior valid samples is between two prior valid samples and five prior valid samples.

Example 28 may include the apparatus of example 25, wherein the compensation scheme includes storing a predefined bit value in place of a bit corresponding to a bit trial where the metastability detector indicates that metastability of the SAR ADC has been detected.

Example 29 may include the apparatus of example 25, wherein the compensation scheme includes storing a bit value from a preceding sample in place of a bit corresponding to a bit trial where the metastability detector indicates that metastability of the SAR ADC has been detected.

Example 30 may include the apparatus of example 25, wherein the compensation scheme includes storing a truncated value of a preceding sample for a current sample corresponding to a conversion for which the metastability detector indicates that metastability of the SAR ADC has been detected.

Example 31 may include the apparatus of example 25, wherein the compensator circuitry is programmable by a user to select the compensation scheme to be implemented.

Example 32 may include the apparatus of example 25, wherein the SAR ADC is an asynchronous ADC.

Example 33 may include a delta sigma modulator (DSM) loop, comprising an asynchronous successive-approximation-register (SAR) analog-to-digital converter (ADC), wherein conversion by the asynchronous SAR ADC is triggered by an ADC clock, a metastability detector coupled to the asynchronous SAR ADC, the metastability detector to detect metastability of the asynchronous SAR ADC, and compensator circuitry coupled to the metastability detector, wherein the compensator circuitry is to implement a compensation scheme in response to the metastability detector detecting metastability of the asynchronous SAR ADC.

Example 34 may include the DSM loop of example 33, wherein the compensation scheme includes outputting, by the compensator circuitry, an average value of a certain number of prior valid samples captured by the compensator circuitry prior to metastability of the asynchronous SAR ADC being detected by the metastability detector.

Example 35 may include the DSM loop of example 34, wherein the certain number of prior valid samples is between two prior valid samples and five prior valid samples.

Example 36 may include the DSM loop of example 33, wherein the compensation scheme includes storing a predefined bit value in place of a bit corresponding to a bit trial where the metastability detector indicates metastability of the asynchronous SAR ADC has been detected.

Example 37 may include the DSM loop of example 33, wherein the compensation scheme includes storing a bit value from a preceding sample in place of a bit corresponding to a bit trial where the metastability detector indicates that metastability of the asynchronous SAR ADC has been detected.

Example 38 may include the DSM loop of example 33, wherein the compensation scheme includes storing a truncated value of a preceding sample for a current sample corresponding to a conversion for which the metastability detector indicates that metastability of the asynchronous SAR ADC has been detected.

Example 39 may include the DSM loop of example 33, wherein the compensator circuitry is programmable by a user to select the compensation scheme to be implemented.

Example 40 may include a method of compensating for metastability of an asynchronous successive-approximation-register (SAR) analog-to-digital converter (ADC), comprising detecting, by a metastability detector, metastability of the asynchronous SAR ADC, detecting, by compensator circuitry coupled to the metastability detector, that the metastability detector has detected metastability of the asynchronous SAR ADC, and implementing, by the compensator circuitry, a compensation scheme in response to detection that the metastability detector has detected metastability of asynchronous SAR ADC.

Example 41 may include the method of example 40, wherein the compensation scheme includes outputting, by the compensator circuitry, an average value of a certain number of prior valid samples captured by the compensator circuitry prior to the metastability detector detecting metastability of the asynchronous SAR ADC.

Example 42 may include the method of example 40, wherein the compensation scheme includes storing a predefined bit value in place of a bit corresponding to a bit trial where the metastability detector detects metastability of the asynchronous SAR ADC.

Example 43 may include the method of example 40, wherein the compensation scheme includes storing a bit value from a preceding sample in place of a bit corresponding to a bit trial where the metastability detector detects metastability of the SAR ADC.

Example 44 may include the method of example 40, wherein the compensation scheme includes storing a truncated value of a preceding sample for a current sample corresponding to a conversion for which the metastability detector detects metastability of the asynchronous SAR ADC.

Note that in this disclosure, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may, or may not necessarily be combined in the same embodiments. It is also important to note that the functions described herein illustrate only some of the possible functions that may be executed by, or within, systems/circuits illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) or examples described herein. Note that all optional features of the apparatus described above may also be implemented with respect to the method or process described herein and specifics in the examples may be used anywhere in one or more embodiments.

What is claimed is:

1. An apparatus for compensating for metastability of a successive-approximation-register (SAR) analog-to-digital converter (ADC), comprising:
   a metastability detector coupled to the SAR ADC, the metastability detector to detect the metastability of the SAR ADC and output an indication that metastability of the SAR ADC has been detected; and
   compensator circuitry coupled to the metastability detector, the compensator circuitry to implement a compensation scheme in response to the indication that metastability of the SAR ADC has been detected by the metastability detector;
   wherein the compensation scheme includes:
   (1) detecting metastability at a bit trial corresponding to an Nth bit position of a current sample, N being a position counting from a most significant bit of the current sample;
   (2) storing a truncated value of a preceding sample having N most significant bits of the preceding sample;
   (3) applying the truncated value to a capacitor digital-to-analog converter of the SAR ADC; and
   (4) continuing with remaining bit trails for the current sample with the truncated value applied to complete conversion of the current sample.

2. The apparatus of claim 1, wherein the compensator circuitry is to implement a further compensation scheme, which includes outputting, by the compensator circuitry, an average value of a certain number of prior valid samples captured by the compensator circuitry prior to the indication that metastability of the SAR ADC has been detected being output by the metastability detector.

3. The apparatus of claim 2, wherein the certain number of prior valid samples is between two prior valid samples and five prior valid samples.

4. The apparatus of claim 1, wherein the compensator circuitry is to implement a further compensation scheme, which includes storing a predefined bit value in place of a bit corresponding to a bit trial where the metastability detector indicates that metastability of the SAR ADC has been detected.

5. The apparatus of claim 1, wherein the compensator circuitry is to implement a further compensation scheme, which includes storing a bit value from a preceding sample in place of a bit corresponding to a bit trial where the metastability detector indicates that metastability of the SAR ADC has been detected.

6. The apparatus of claim 1, wherein the compensation scheme further includes using redundancy in the SAR ADC to compensate for the remaining bit trials.

7. The apparatus of claim 1, wherein the compensator circuitry is programmable by a user to select the compensation scheme to be implemented.

8. The apparatus of claim 1, wherein the SAR ADC is an asynchronous ADC.

9. A delta sigma modulator (DSM) loop, comprising:
an asynchronous successive-approximation-register (SAR) analog-to-digital converter (ADC), wherein conversion by the asynchronous SAR ADC is triggered by an ADC clock;
a metastability detector coupled to the asynchronous SAR ADC, the metastability detector to detect metastability of the asynchronous SAR ADC; and
compensator circuitry coupled to the metastability detector, wherein the compensator circuitry is to implement a compensation scheme in response to the metastability detector detecting metastability of the asynchronous SAR ADC;
wherein the compensation scheme includes:
(1) detecting metastability at a bit trial corresponding to an Nth bit position of a current sample, N being a position counting from a most significant bit of the current sample;
(2) storing a truncated value of a preceding sample having N most significant bits of the preceding sample;
(3) applying the truncated value to a capacitor digital-to-analog converter of the SAR ADC; and
(4) continuing with remaining bit trails for the current sample with the truncated value applied to complete conversion of the current sample.

10. The DSM loop of claim 9, wherein the compensator circuitry is to implement a further compensation scheme, which includes outputting, by the compensator circuitry, an average value of a certain number of prior valid samples captured by the compensator circuitry prior to metastability of the asynchronous SAR ADC being detected by the metastability detector.

11. The DSM loop of claim 10, wherein the certain number of prior valid samples is between two prior valid samples and five prior valid samples.

12. The DSM loop of claim 9, wherein the compensator circuitry is to implement a further the compensation scheme, which includes storing a predefined bit value in place of a bit corresponding to a bit trial where the metastability detector indicates metastability of the asynchronous SAR ADC has been detected.

13. The DSM loop of claim 9, wherein the compensator circuitry is to implement a further compensation scheme which includes storing a bit value from a preceding sample in place of a bit corresponding to a bit trial where the metastability detector indicates that metastability of the asynchronous SAR ADC has been detected.

14. The DSM loop of claim 9, wherein the compensation scheme further includes using redundancy in the SAR ADC to compensate for the remaining bit trials.

15. The DSM loop of claim 9, wherein the compensator circuitry is programmable by a user to select the compensation scheme to be implemented.

16. A method of compensating for metastability of an asynchronous successive-approximation-register (SAR) analog-to-digital converter (ADC), comprising:
detecting, by a metastability detector, metastability of the asynchronous SAR ADC;
detecting, by compensator circuitry coupled to the metastability detector, that the metastability detector has detected metastability of the asynchronous SAR ADC; and
implementing, by the compensator circuitry, a compensation scheme in response to detection that the metastability detector has detected metastability of asynchronous SAR ADC;
wherein implementing the compensation scheme includes:
(1) detecting metastability at a bit trial corresponding to an Nth bit position of a current sample, N being a position counting from a most significant bit of the current sample;
(2) storing a truncated value of a preceding sample having N most significant bits of the preceding sample;
(3) applying the truncated value to a capacitor digital-to-analog converter of the SAR ADC; and
(4) continuing with remaining bit trails for the current sample with the truncated value applied to complete conversion of the current sample.

17. The method of claim 16, further comprising, implementing a further compensation scheme, which includes outputting, by the compensator circuitry, an average value of a certain number of prior valid samples captured by the compensator circuitry prior to the metastability detector detecting metastability of the asynchronous SAR ADC.

18. The method of claim 16, further comprising, implementing a further compensation scheme, which includes storing a predefined bit value in place of a bit corresponding to a bit trial where the metastability detector detects metastability of the asynchronous SAR ADC.

19. The method of claim 16, further comprising, implementing a further compensation scheme which includes storing a bit value from a preceding sample in place of a bit corresponding to a bit trial where the metastability detector detects metastability of the SAR ADC.

20. The method of claim 16, wherein implementing the compensation scheme further includes using redundancy in the SAR ADC to compensate for the remaining bit trials.

* * * * *